United States Patent [19]

Ono

[11] Patent Number: 5,731,213
[45] Date of Patent: Mar. 24, 1998

[54] SEMICONDUCTOR LIGHT RECEIVING DEVICE AND METHOD OF MANUFACTURING THE SAME

[75] Inventor: Reiji Ono, Yokohama, Japan

[73] Assignee: Kabushiki Kaisha Toshiba, Kawasaki, Japan

[21] Appl. No.: 423,140

[22] Filed: Apr. 18, 1995

Related U.S. Application Data

[63] Continuation of Ser. No. 188,123, Jan. 28, 1994, abandoned, which is a continuation of Ser. No. 88,528, Jul. 9, 1993, abandoned.

[30] Foreign Application Priority Data

Jul. 28, 1992 [JP] Japan .................................. 4-219600

[51] Int. Cl.$^6$ ............................................ H01L 31/236
[52] U.S. Cl. ........................... 437/5; 136/252; 136/256; 156/644.1
[58] Field of Search .............................. 437/3, 5, 228, 437/2; 257/21, 461, 436; 136/259, 252, 256; 156/644.1, 647.1, 628.1

[56] References Cited

U.S. PATENT DOCUMENTS

| | | | |
|---|---|---|---|
| 4,125,427 | 11/1975 | Chen et al. | 156/657 |
| 4,277,793 | 7/1981 | Webb | 257/436 |
| 4,321,611 | 3/1982 | Conti | 257/436 |
| 4,354,898 | 11/1982 | Goldren et al. | 156/647 |
| 4,360,701 | 11/1982 | Evans | 136/259 |
| 4,468,850 | 8/1984 | Liau et al. | 156/649 |
| 4,582,390 | 4/1986 | Furuya | 385/131 |
| 4,608,451 | 8/1986 | Landis | 136/256 |
| 4,620,364 | 11/1986 | Landis | 136/256 |
| 4,829,013 | 5/1989 | Yamazaki | 437/5 |
| 4,989,972 | 2/1991 | Braun | 257/436 |
| 4,990,989 | 2/1991 | Elttamamsy et al. | 257/436 |
| 4,994,142 | 2/1991 | Appelbaum | 156/647 |
| 5,024,953 | 6/1991 | Uematsu et al. | 136/259 |
| 5,080,725 | 1/1992 | Green et al. | 136/256 |
| 5,081,049 | 1/1992 | Green et al. | 136/256 |
| 5,100,478 | 3/1992 | Kawagata | 437/5 |
| 5,120,664 | 6/1992 | Murotani | 437/5 |
| 5,217,539 | 6/1993 | Frass et al. | 136/246 |
| 5,261,970 | 11/1993 | Laundis et al. | 437/5 |
| 5,330,932 | 7/1994 | Liu et al. | 437/133 |
| 5,422,299 | 6/1995 | Neudeck et al. | 437/63 |

*Primary Examiner*—John Niebling
*Assistant Examiner*—S. Mulpuri
*Attorney, Agent, or Firm*—Finnegan, Henderson, Farabow, Garrett & Dunner, L.L.P

[57] ABSTRACT

A semiconductor light receiving device includes a semiconductor crystal substrate having a principle plane which almost coincides with a crystal face having a low order face orientation index, a light detecting portion, formed on a surface of the semiconductor crystal substrate or inside the semiconductor crystal substrate, for converting incident light into an electric signal, and a light incident region formed on the principle plane of the semiconductor crystal substrate, for guiding light into the light detecting portion. The surface of at least the optical incident region on the principle plane of the semiconductor crystal substrate is an uneven surface constituted by a large number of crystal faces each having a face orientation index having an order higher than that of the crystal face of the semiconductor crystal substrate. As a result, a surface inclined with respect to incident light is obtained without inclining the semiconductor light receiving device itself with respect to the incident light, and the light receiving device can easily be mounted on an optical semiconductor device, so that a decrease in S/N ratio of an output signal and degradation of minimum light receiving output characteristics can be prevented.

6 Claims, 7 Drawing Sheets

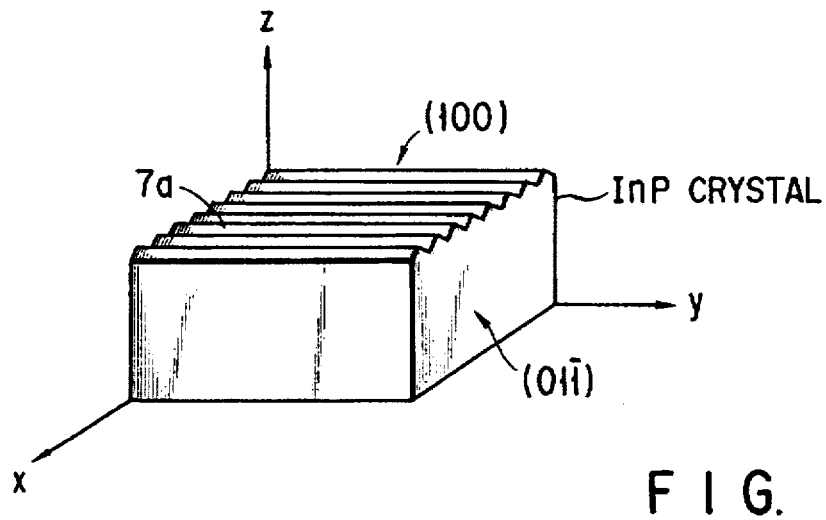
F I G. 5A
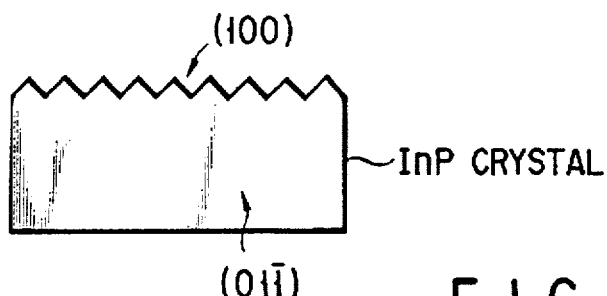
F I G. 5B
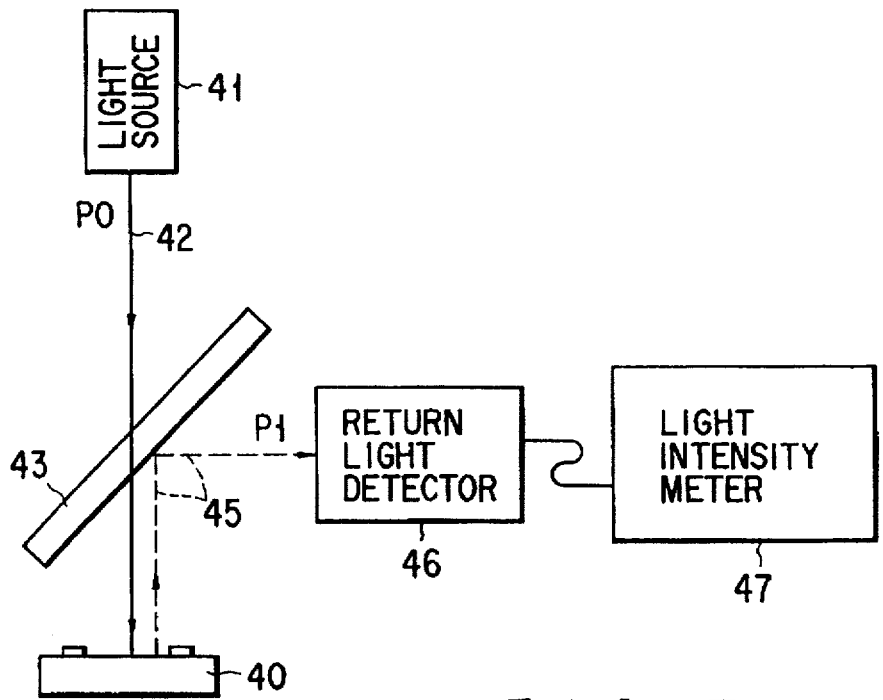
F I G. 7

SEMICONDUCTOR LIGHT RECEIVING DEVICE AND METHOD OF MANUFACTURING THE SAME

This application is a continuation of application Ser. No. 08/188,123, now abandoned filed Jan. 28, 1994, which is a continuation of application Ser. No. 08/088,528, filed Jul. 9, 1993, now abandoned.

BACKGROUND OF THE INVENTION

1. Field of the Invention

The present invention relates to a semiconductor light receiving device and a method of manufacturing the same and, more particularly, to a semiconductor light receiving device having a return light blocking mechanism and a method of manufacturing the same.

2. Description of the Related Art

In recent years, a large number of optical devices using, e.g., InP semiconductor crystals, have been developed. A light receiving device used in each optical device has a function of converting an incident light into a current signal.

FIGS. 1A to 1D are sectional views showing the steps in manufacturing a conventional semiconductor light receiving device. As shown in FIG. 1A, an InP buffer layer 92, an InGaAs light absorbing layer 93, an InGaAsP anti-melt back layer 94, and an InP window layer 95 are sequentially stacked by a liquid phase crystal growth method on a crystal surface of a face orientation (100) of a semiconductor substrate 91 consisting of an InP crystal. When a vapor phase growth method such as an MOCVD method or a chloride CVD method is used as the crystal growth method, an InP wafer which has a principle plane of the face orientation (100) or a principle plane inclined with respect to the face orientation (100) is used. An InP buffer layer, an InGaAs light absorbing layer, and an InP window layer are sequentially stacked on the InP wafer. In this case, the InGaAsP anti-melt back layer is not used. As shown in FIG. 1B, a mask 96 is formed on the InP window layer 95 to selectively diffuse Zn. Then the Zn is diffused in the resultant structure by a sealed tube diffusion method to form a P-type region 97. As shown in FIG. 1C, a P-type electrode 98 is deposited on an end portion of the mask 96 and on the InP window layer 95 on which the P-type region 97 is formed. As shown in FIG. 1D, an anti-reflection film 99 for blocking return light is formed on the P-type region 97. An N-type electrode 100 is deposited on the lower surface of the InP substrate. The electrode metal is alloyed in an alloy furnace. In a light receiving device of upper surface incident type formed as described above, a light detecting portion constituted by a P-N junction is formed. The P-N junction is located on a boundary of the P-type region 97 and the InGaAs light absorbing layer 93 and is parallel to the principle plane of the semiconductor substrate 91. The light detecting portion has a function of converting an incident light into an electric signal. The anti-reflection film 99 is formed on the flat surface light incident region which almost coincides with the (100) face serving as a crystal surface having a low order face orientation index. The anti-reflection film 99 has a function of decreasing the reflectance of the incident light. If the incident light is reflected from the surface of the light receiving device, and the reflected light is returned to a light source, e.g., a light emitting device, the optical and electric characteristics of the light emitting device are degraded. However, this reflection is prevented by the anti-reflection film 99. Since the anti-reflection film 99 is formed to have a thickness corresponding to a wave-length of ($\frac{1}{4}$)λ with respect to the center wave-length λ of the incident light, the reflectance is increased as the wave-length is deviated from the center wave-length λ of the incident light.

As shown in FIG. 2, a light receiving device 101 is mounted on an optical semiconductor device to be inclined with respect to incident light 102, thereby preventing reflected light 103 from being returned to a light source. Although the light receiving device 101 is mounted on the optical semiconductor device at an incline, since the capillary of a bonding apparatus is moved only vertically with respect to the bonding apparatus, a fixing jig has to be arranged on the optical semiconductor device such that an inclined surface 104b of a member 104 having an inclined portion 104a is kept horizontal. The light receiving device 101 is first mounted on the inclined surface 104b to be kept horizontal. In this state, metal wires 106 are then formed by the bonding apparatus between the light receiving device 101 and lead pins 105 of the optical semiconductor device.

In the above conventional light receiving device, since the light receiving device itself is arranged to be inclined with respect to the incident light, the effective area of the light incident region is decreased as the inclination angle of the light receiving device is increased. An optical current generated by the light detecting portion for converting the incident light into an electric signal is decreased. When the effective area of the light incident region is decreased as described above, the light receiving device cannot easily be coupled optically to the light source such as a light emitting diode or an optical fiber. In addition, when an optical current is decreased, the S/N ratio of an output signal is decreased, and minimum light receiving output characteristics are degraded. Further, as shown in FIG. 2, in order to fix the light receiving device such that the inclined surface 104b of the member 104 having the inclined portion 104a is kept horizontal, a special fixing jig is required. Since the angle of the fixing jig is normally fixed, when the angle of the inclined surface 104b is changed, the fixing jig must be replaced every time the inclined surface 104b is changed. In addition, the wiring region of the lead pins 105 and the wiring region of the light receiving device 101 have the above inclination angles. For this reason, when a wiring operation is performed to an inclined surface by the bonding apparatus, a wiring strength is degraded due to insufficient bonding.

SUMMARY OF THE INVENTION

The present invention has been made to solve the above problems, and has as its object to provide a semiconductor light receiving device which can obtain an inclined surface with respect to the incident light without inclining the light receiving device itself with respect to the incident light, and can easily be mounted on an optical semiconductor device so as to prevent a decrease in S/N ratio of an output signal and degradation of minimum light receiving output characteristics, and a method of manufacturing the same.

According to an aspect of the present invention, there is provided a semiconductor light receiving device comprising a semiconductor crystal substrate having a principle plane which almost coincides with a crystal face having a low order face orientation index, a light detecting portion, formed on a surface of the semiconductor crystal substrate or inside the semiconductor crystal substrate, for converting an incident light into an electric signal, and a light incident region, formed on the principle plane of the semiconductor crystal substrate and being an uneven surface having at least a principle plane constituted by a large number of crystal faces each having a face orientation index having an order higher than that of the crystal face having the low order face orientation index, for guiding a light into the light detecting portion.

According to another aspect of the present invention, there is provided a method of manufacturing semiconductor light receiving device comprising the steps of stacking a plurality of semiconductor layers of a first conductivity type to form a multilayered semiconductor substrate, diffusing an impurity of a second conductivity type in the multilayered semiconductor substrate to form a region of the second conductivity type in the multilayered semiconductor substrate, etching a light incident surface of the region of the second conductivity type to form an uneven surface, and forming electrodes for external connection on upper and lower surfaces of the multilayered semiconductor substrate.

When the crystal surface of a low order face orientation index of the semiconductor substrate is etched by using a vapor phase etching gas or a liquid phase etchant having a dependency on a face orientation index, the crystal surface becomes an uneven surface constituted by a large number crystal surfaces each having a high order face orientation index, thereby obtaining a return light blocking mechanism. Therefore, an inclined surface can be obtained with respect to the incident light without inclining the light receiving device itself with respect to the incident light, and the effective area of the light incident region is not decreased. As a result, the S/N ratio of an output signal is increased and minimum light receiving output characteristics is improved. In addition, the light receiving device can easily be mounted on an optical semiconductor device without using a special fixing jig, and the principle plane of the wiring region of the light receiving device becomes parallel to the principle plane of the wiring region of lead pins, so that the wiring strength of metal wires is not easily degraded.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A and 5B are views showing the uneven surface of an InP substrate, in which FIG. 5A is a perspective view and FIG. 5B is a sectional view;

FIG. 7 is a view showing the arrangement of a measuring system for measuring strength of a return light from the light receiving device;

FIGS. 9A and 9B are histograms showing results obtained by the measuring distribution states of the tensile strengths of gold lines connected between the light receiving device and lead pins of an optical semiconductor device on which the light receiving device is mounted, in which FIG. 9A shows a measurement result obtained in the present invention and FIG. 9B shows a conventional measurement result;

DETAILED DESCRIPTION OF THE PREFERRED EMBODIMENTS

Embodiments of the present invention will be described below with reference to the accompanying drawings.

Figure 1A:
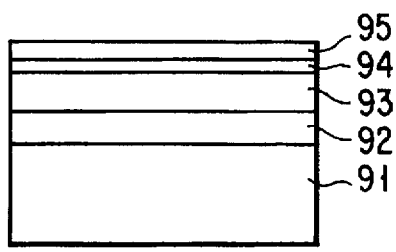
FIGS. 1A to 1D are views showing the steps in manufacturing a conventional light receiving device of upper surface incident type.
Figure 1B:
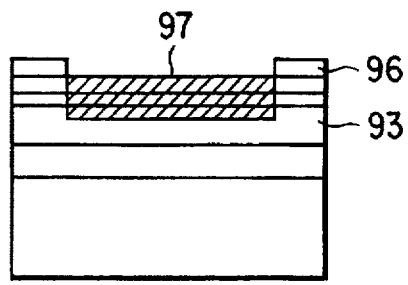
Figure 1C:
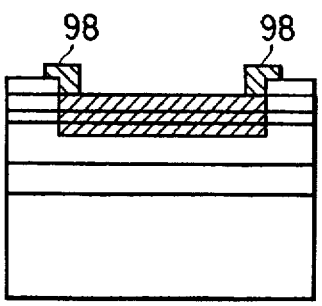
Figure 1D:
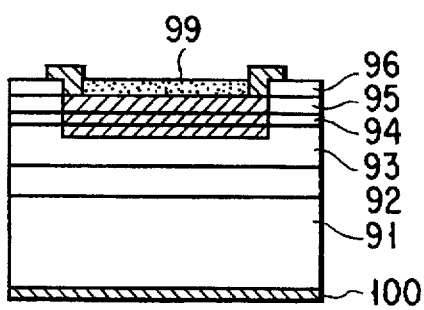
Figure 2:
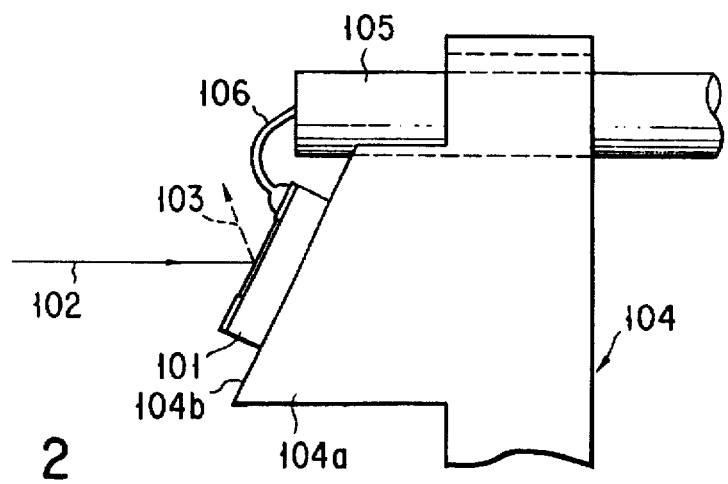
FIG. 2 is a side view showing a part of an optical semiconductor device on which the conventional light receiving device of upper surface incident type is mounted.
Figure 3A:
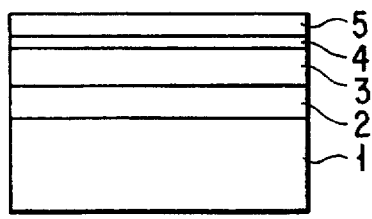
FIG. 3A to 3E are views showing the steps in manufacturing a light receiving device of upper surface incident type according to the first embodiment of the present invention.
Figure 3B:
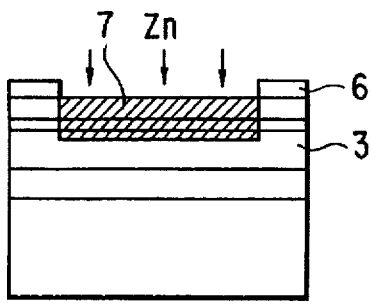
Figure 3C:
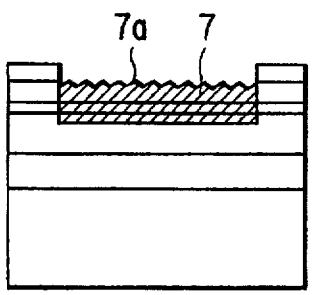
Figure 3D:
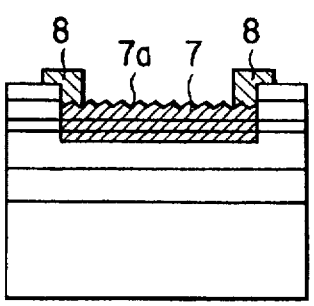
Figure 3E:
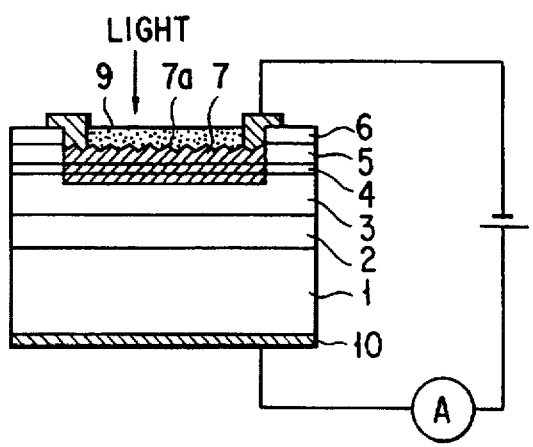

FIGS. 3A to 3E are sectional views showing the steps in manufacturing an InP-based light receiving device of upper surface incident type according to the first embodiment of the present invention. The light receiving device of upper surface incident type is a device in which a light beam is incident on an upper surface, diffused with an impurity, of a semiconductor substrate. FIG. 3A explains the step of stacking a semiconductor substrate. As shown in FIG. 3A, an InP buffer layer 2, an InGaAs light absorbing layer 3, an InGaAsP anti-melt back layer 4, and an undoped InP window layer 5 are sequentially stacked by a liquid phase crystal growth method on a crystal surface of a semiconductor substrate of an InP crystal. The crystal surface has a face orientation (100). FIG. 3B explains the step of forming a P-type region 7. As shown in FIG. 3B, a mask 6 is formed on the InP window layer 5 to selectively diffuse Zn. The Zn is diffused in the resultant structure by a sealed tube diffusion method to form the P-type region 7. In the sealed tube diffusion method, after the Zn is placed in a quartz tube (not shown), the quartz tube is evacuated to have a pressure of $10^{-6}$ Torr. The quartz tube is then heated to a high temperature of about 550° C. for 15 to 30 minutes while the phosphorus partial pressure is held, thereby diffusing the Zn in the quartz tube. The Zn is diffused to the middle of the InGaAs light absorbing layer 3 through the undoped InP window layer 5 and the InGaAsP anti-melt back layer 4 to form the P-type region 7. The Zn is doped in the crystal of the undoped InP window layer 5 as a dopant used in an etching process in FIG. 3C. A P-N junction portion between the P-type region 7 and the InGaAs light absorbing layer 3 is operated as a light detecting portion to be described later. FIG. 3C explains the step of forming an inclined surface, i.e., an uneven surface 7a, on the surface of the P-type region 7. As shown in FIG. 3C, the P-type region 7, i.e., a crystal surface having a low order face orientation index is etched by using a vapor phase etching gas or a liquid phase etchant having a face orientation dependency, e.g., a hydrochloric acid-based etchant. The uneven surface 7a constituted by a large number of continuous, inclined crystal faces each having high order face index is formed. The uneven surface 7a will be described later. FIGS. 3D and 3E explain the step of forming electrodes. As shown in FIG. 3D, a P-type electrode 8 is deposited by an electron beam deposition method on the InP window layer 5 and on an end portion of the diffusion mask 6. The P-type electrode 8 is connected to a lead pin. As shown in FIG. 3E, an anti-reflection film 9 for blocking return light is formed on the P-type region 7 by a plasma CVD device. An N-type electrode 10 is deposited on the lower surface of the semiconductor substrate 1 by an electron beam deposition method. The electrode metal is then alloyed in an alloy furnace. This anti-reflection film 9 consists of $SiN_2$, $SiO_2$ or the like. The film 9 has a thickness corresponding to a wave-length of (¼)λ with respect to an incident light wave-length λ. In the light receiving device of upper surface incident type manufactured as described above, the light detecting portion is stacked on the principle plane of the semiconductor substrate 1 and has the P-N junction almost parallel to the principle plane of the substrate, thereby obtaining a function of converting an incident light into an electric signal. The uneven surface 7a is formed on the surface of the light incident region in the step shown in FIG. 3C. The uneven surface 7a is constituted by a large number of continuous crystal faces each having a high order face orientation index. Therefore, the light receiving device of upper surface incident type provides a return light blocking function.

Figure 4:
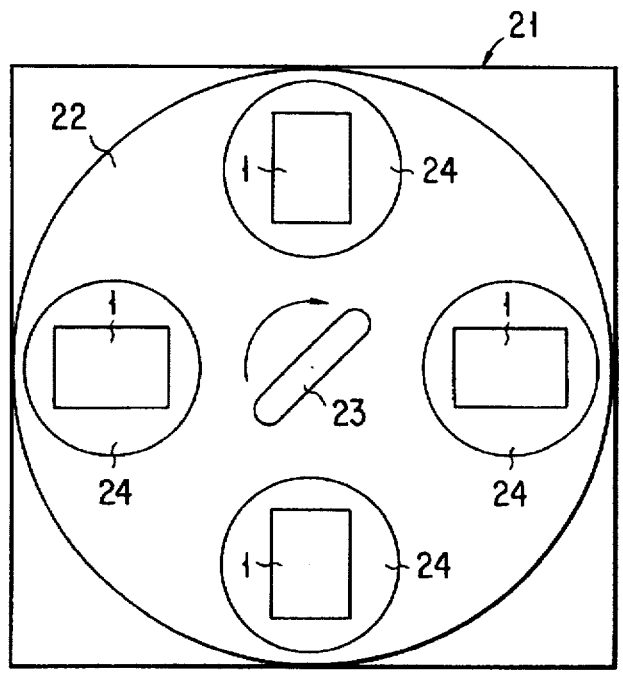
FIG. 4 is a plan view showing an etching device used in the steps of FIG. 3C.

FIG. 4 is a plan view showing an etching device used in the step of etching a light incident region. A rotor 23 for rotating an etching solution is arranged at the center of a petri dish 22 on a stirrer 21. The etching solution may be rotated in the clockwise direction or the counterclockwise direction. The InP substrates 1 respectively adhered on acid-resistant holders 24 are arranged around the rotor 23. An etching solution is supplied in the petri dish 22. The etching solution is rotated by the rotor 23 of the center of the petri dish 22 at a rotational speed of 1,000 rpm for 10 minutes, for example, so as to etch the semiconductor substrates 1.

A reason for the fact that the uneven surface 7a is formed on the surface of the semiconductor substrate by an etching process according to the present invention will be described below. When different atoms from Inp atoms are doped in an InP crystal substrate, i.e., the undoped InP window layer 5 in the first embodiment, the type of atoms, i.e., either In or P atoms, to be replaced with the dopants is determined depending on the types of the dopants. In this case, Zn (or Sn atoms are doped, the In atoms are replaced with the Zn (or Sn) atoms. A face orientation dependency of an etching rate is changed depending on a doped position in the InP crystal, the type of an etchant, and an etching method. When the (100) face of the InP crystal doped with Zn (or Sn) is etched by using an appropriate etchant and an appropriate etching method, faces each having a high order face orientation index and constituted by the In and Zn (or Sn) each having a low etching rate are formed. That after the etching is performed, the surface of the InP crystal is, as illustrated in FIGS. 5A and 5B, constituted by a large number of faces which are perpendicular to the (00$\bar{1}$) face and each of which has an inclination angle with respect to the (100) principle plane. The uneven surface 7a inclined with respect to the (100) principle plane of the InP crystal is formed by the etching process of the present invention under the following conditions. The conditions are uniquely determined by the following factors: (1) the size of a wafer, (2) the concentration of an etching solution, (3) the composition of the etching solution, (4) the temperature of the etchant; and the like. When the respective factors are satisfied under one condition, the uneven surface 7a having a specific inclination angle is uniquely formed. When each factor is not satisfied, the uneven surface 7a is not formed. One of the factors is changed, the uneven surface 7a having another specific inclination angle is uniquely formed, and the uneven surfaces 7a having other inclination angles are not formed. Note that the flow rate of the etching solution must be higher than a certain value to form the uneven surface 7a by the etching process of the present invention.

Figure 6A:
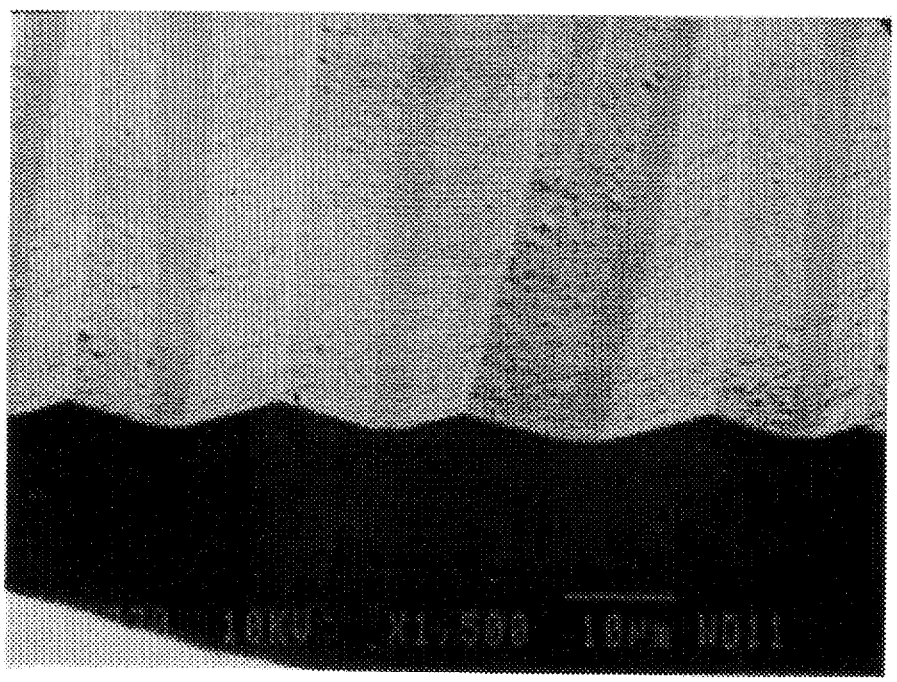
FIGS. 6A and 6B are photomicrographs showing a crystal structure, having a high order face orientation index, of a light incident region surface obtained in FIGS. 3A to 3E.
Figure 6B:
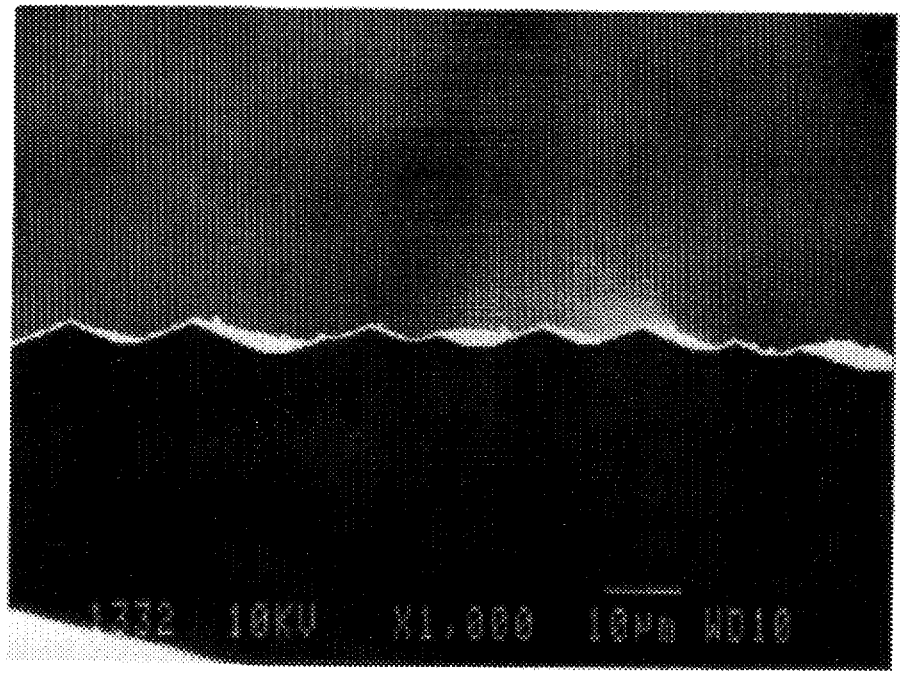

FIG. 6A is a photomicrograph obtained by observing the uneven surface 7a having crystal faces each having a high order face orientation index and formed on the surface of the light incident region. FIG. 6B is a photomicrograph showing a sectional structure of the crystal faces each having a high order face orientation index. FIGS. 6A and 6B are obtained such that the inclined uneven surface 7a is photographed by using a scanning electron microscope (SEM) under the following conditions. That is, an acceleration voltage is 30 kV, a magnification is 1,500, a reference length is 10 μm, and a working distance is 11. FIG. 6A is obtained by photographing the uneven surface 7a in a direction perpendicular to the (01$\bar{1}$) face from the upper direction of the (100) principle plane. As is apparent from FIG. 6A, a fine inclined uneven surface formed on the surface of the InP crystal can be clearly observed. FIG. 6B is obtained by photographing a section in a direction perpendicular to the face orientation (01$\bar{1}$) of the InP crystal. As is apparent from FIG. 6B, a fine uneven surface can be clearly observed. An inclined surface is conventionally formed on a crystal face using a resist or the like. However, a fine inclined uneven surface formed on a crystal face by etching process can be realized by the present invention for the first time in this field.

FIG. 7 is a block diagram showing the arrangement of a measuring system for measuring the intensity of return light from a light receiving device. Reference numeral 40 denotes a light receiving device; 41, a light source; 42, incident light; 43, a half mirror; 45, return light; 46, a return light detector; and 47, a light-intensity meter. The incident light 42 having an intensity P0 and output from the light source 41 is incident on the light receiving device 40 through the half mirror 43. In this case, part of the incident light 42 is reflected by the light incident region of the light receiving device 40 to form the return light 45. The return light 45 reaches the half mirror 43 to be reflected from the surface thereof. The return light 45 is detected by the return light detector 46. An intensity P1 of the return light 45 is measured by the light intensity meter 47, thereby obtaining the return light intensity P1 (reflectance) with respect to the incident light output intensity P0.

Figure 8:
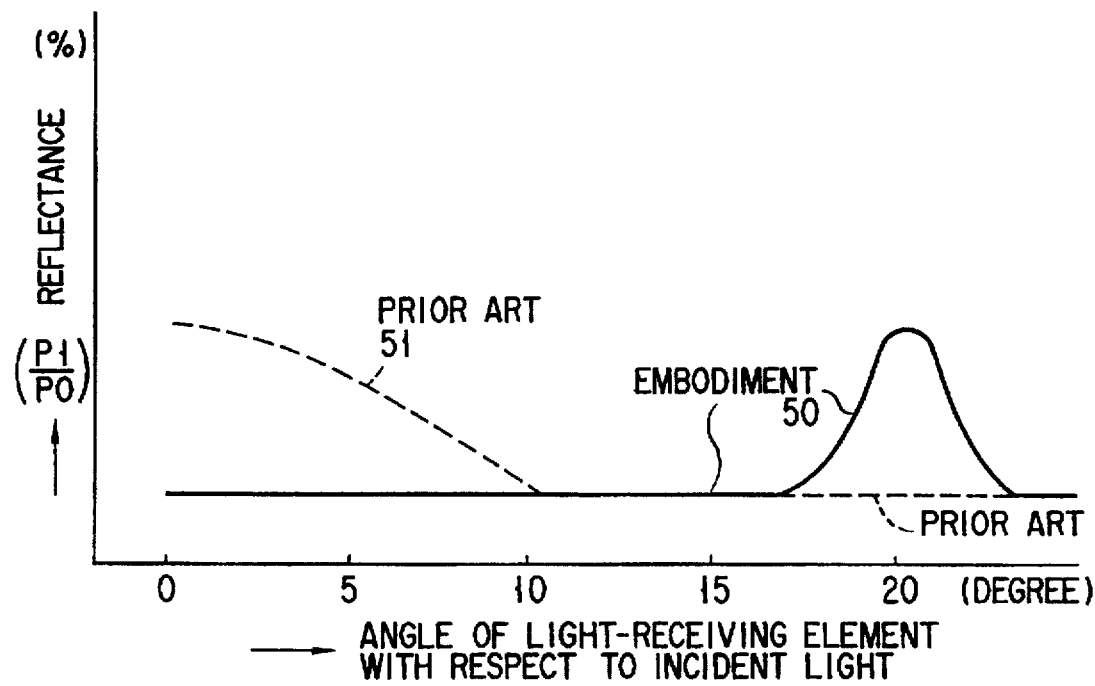
FIG. 8 is a graph showing results obtained by measuring reflectances by using the measuring system in FIG. 7.

FIG. 8 is a graph showing results obtained by measuring reflectances by the measuring system in FIG. 7. FIG. 8 shows results obtained by measuring reflectances while a state (the light receiving device has an inclination angle of 0°) wherein the surface of the light incident region of the light receiving device is arranged to be perpendicular to the incident light is changed to a state wherein the surface of the light incident region of the light receiving device is inclined by, e.g., 30° with respect to the incident light. In FIG. 8, a solid line 50 indicates a measurement result of the light receiving device of upper surface incident type having the return light blocking function of the first embodiment. A broken line 51 indicates a measurement result of the conventional light receiving device of upper surface incident type. In the light receiving device of the first embodiment, a low reflectance is obtained even when the light receiving device is inclined by an angle of 0°. When the light receiving device is gradually inclined, a maximum reflectance is obtained when the uneven surface formed on the surface of the light incident region is inclined by an angle of about 20°. When the uneven surface is inclined by an angle of 20° or more, the reflectance is decreased. On the other hand, in the conventional light receiving device, a maximum reflectance is obtained when the light receiving device is inclined by an angle of 0°. When the light receiving device is gradually inclined, the reflectance is decreased accordingly. A minimum reflectance is obtained when the incident angle is almost 12°. According to the above results, in the light receiving device of the first embodiment, it was confirmed that the intensity of the return light was decreased even when the inclination angle of the light receiving device was 0°.

Figures 9A, 9B:
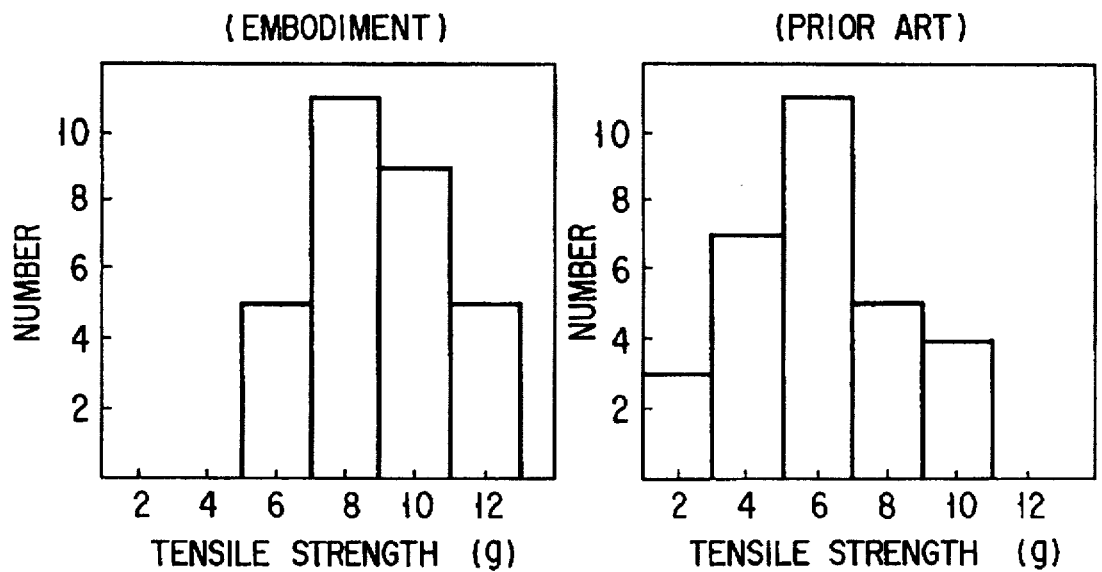

FIG. 9A is a histogram showing results obtained by measuring a distribution of the tensile strengths of gold wires connected between the light receiving device of the first embodiment and the lead pins of an optical semiconductor device on which the light receiving device is mounted. In this measurement, 30 samples were used. In comparison with this, FIG. 9B shows results obtained by measuring a distribution state of the tensile strengths of gold wires 106 connected between a conventional light receiving device 101 and lead pins 105 of an optical semiconductor device on which the light receiving device 101 is mounted. According to the above results, in the light receiving device of the first embodiment, since the wiring region of the light receiving device is parallel to the wiring region of the lead pins, a sufficient wiring strength can be obtained by the bonding apparatus in both the wiring regions. Therefore, it was confirmed that the tensile strength of gold wires is not decreased.

According to the light receiving device of the first embodiment of the present invention, when the crystal face, having a low order face orientation index, of the semiconductor device is etched by using a vapor phase etching gas or a liquid phase etchant having a face orientation dependency, the uneven surface 7a constituted by a large number of crystal faces each having a high-order face orientation index is formed on the surface of the semiconductor substrate, thereby obtaining a return light blocking function. Therefore, even when the light receiving device itself is not inclined with respect to incident light, a surface inclined with respect to the incident light can be obtained. Thus, the effective area of the light incident region is not decreased. The S/N ratio of an output signal is increased. Minimum light receiving output characteristics are improved. Note that the S/N ratio is given by Io/Id, where Io is an optical current determined by incident light and the like, and Id is a dark current uniquely determined by a device. The light receiving device can easily be mounted on an optical semiconductor device without any special fixing jig. In addition, the surface of the wiring region of the light receiving device is parallel to the surface of the wiring region of the lead pins of the optical semiconductor device. As a result, the wiring strength of a metal wire is not degraded.

Figure 10A:
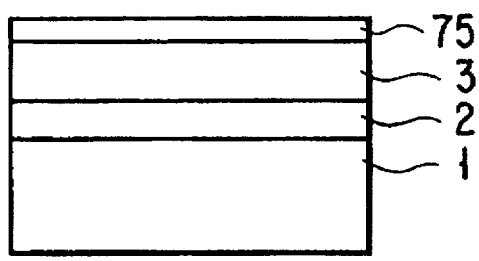
FIGS. 10A to 10E are views showing the steps in manufacturing a light receiving device of upper surface incident type according to the second embodiment of the present invention.
Figure 10B:
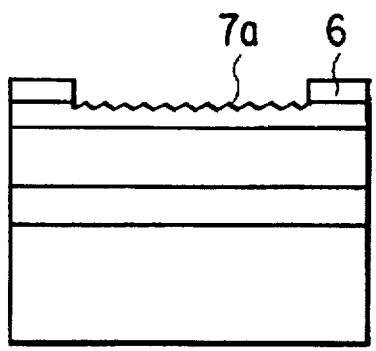
Figure 10C:
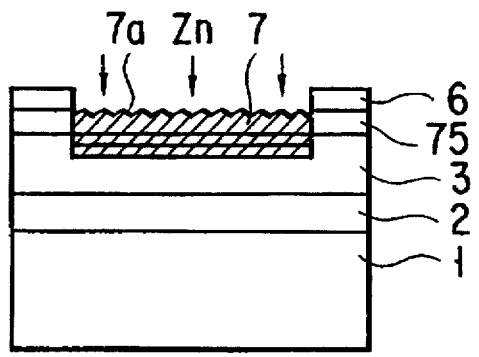
Figure 10D:
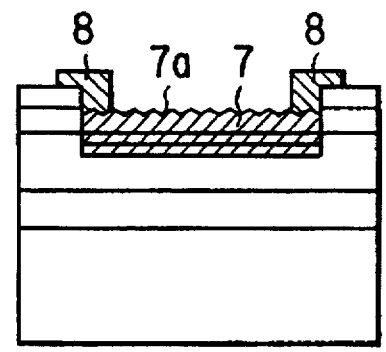
Figure 10E:
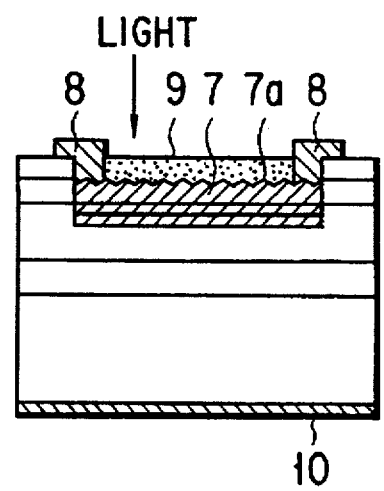

FIGS. 10A to 10E are sectional views showing the steps in manufacturing an InP-based light receiving device of upper surface incident type according to the second embodiment of the present invention. FIG. 10A explains the step of stacking a semiconductor substrate. As shown in FIG. 10A, an InP buffer layer 2, an InGaAs light absorbing layer 3, and an Sn-doped Inp window layer 75 are sequentially stacked by a MOCVD method on a crystal surface, having the (100) face orientation, of a semiconductor substrate 1 of an InP crystal. In the second embodiment, a layer in which the Sn is doped as a dopant in advance is used as the InP window layer 75. FIG. 10B explains the step of forming an inclined surface. As shown in FIG. 10B, a mask 6 used for selectively diffusing the Zn is formed on the Sn-doped InP window layer 75. In addition, the light incident region of the substrate is etched by using a vapor phase etching gas or a liquid phase etchant having a face orientation dependency to form an uneven surface 7a constituted by a large number of continuous, inclined crystal faces each having a high order face orientation index on the surface of the light incident region. FIG. 10C explains the step of forming a P-type region 7. In the second embodiment, the P-type region 7 is formed after the step of forming an inclined surface is performed. As shown in FIG. 10C, the Zn is diffused by a sealed tube diffusion method to form the P-type region 7. Since the detail of the P-type region 7 is the same as that of the P-type region 7 in the first embodiment, a description thereof will be omitted. FIGS. 10D and 10E explain the steps of forming electrodes. As shown in FIG. 10D, a P-type electrode 8 is deposited by an electron beam deposition method on an end portion of the selective 6 and on the Sn-doped InP window layer 75 in which the P-type region 7 is formed. As shown in FIG. 10E, an anti-reflection film 9 for blocking the return light is formed in the light incident region by a plasma CVD device. An N-type electrode 10 is deposited on the lower surface of the Inp substrate by a resistive heating method and an electron beam deposition method. The electrode metal is then alloyed in an alloy furnace. In the light receiving device of upper surface incident type according to the second embodiment, the same effect as that in the light receiving device of upper surface incident type of the first embodiment can be obtained.

Figure 11A:
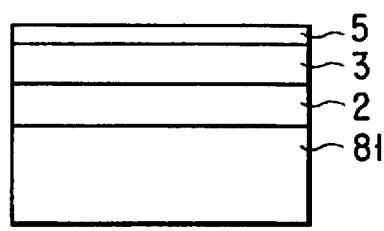
FIGS. 11A to 11F are views showing the steps in manufacturing a light receiving device of lower surface incident type according to the third embodiment of the present invention.
Figure 11D:
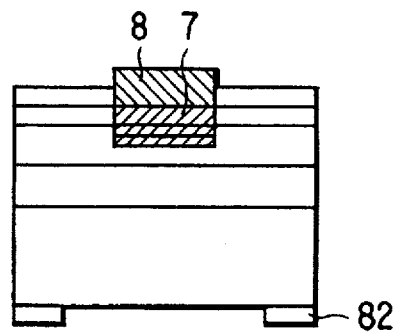
Figure 11B:
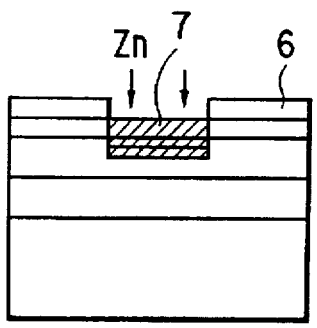
Figure 11E:
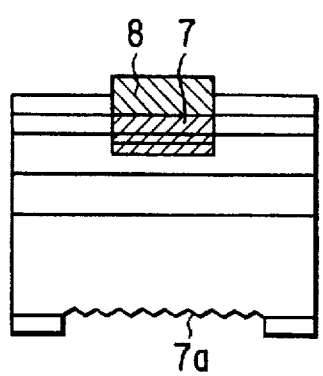
Figure 11C:
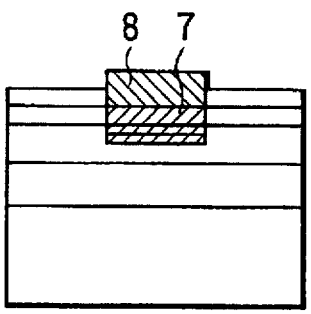
Figure 11F:
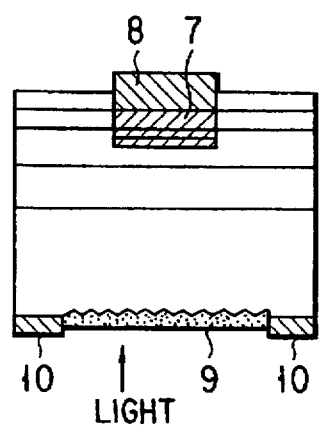

FIGS. 11A to 11F are sectional views showing the steps in manufacturing an InP-based light receiving device of lower surface incident type according to the third embodiment of the present invention. The light receiving device is such device that light is incident on a semiconductor substrate side opposite to a side diffused with an impurity. FIG. 11A explains the step of stacking a semiconductor substrate. As shown in FIG. 11A, an InP buffer layer 2, an InGaAs light absorbing layer 3, and an InP window layer 5 are sequentially stacked by a chloride CVD method on an Sn-doped Inp substrate 81 having a principle plane slightly inclined from the (100) face orientation, e.g., a principle plane inclined by 2° in the <110> direction. In the third embodiment, a substrate in which the Sn is doped as a dopant in advance is used as the Sn-doped InP substrate 81. FIG. 11B explains the step of forming a P-type region 7. As shown in FIG. 11B, a mask 6 used for selectively diffusing the Zn is first formed on the InP window layer 5. The Zn is then diffused in the resultant structure by the sealed tube diffusion method to form a P-type region 7. As shown in FIG. 11C, a P-type electrode 8 is deposited on the P-type region 7 by an electron beam deposition method. As shown in FIG. 11D, a dielectric thin film 82 whose light incident region is exposed is formed by the plasma CVD device at a portion opposite to the P-type region 7 on the lower surface of the Sn-doped InP substrate 81. FIG. 11E explains the step of forming an inclined surface. As shown in FIG. 11E, the light incident region is etched by using the vapor phase etching gas or the liquid phase etchant having a face orientation dependency to form an uneven surface 7a. The uneven surface 7a is constituted by a large number of continuous, inclined crystal faces each having a high order face orientation index on the surface of the light incident region. As shown in FIG. 11F, an anti-reflection film 9 for blocking the return light is formed on the light incident region. An N-type electrode 10 is deposited outside the light incident region by the resistive heating method or the electron beam deposition method. The electrode metal is then alloyed in the alloy furnace. The electrons are formed by the steps shown in FIGS. 11C, 11D, and 11F. In the third embodiment, a light is incident on the lower surface of the semiconductor substrate, i.e., on the Sn-doped InP substrate 81 side. The light is photoelectrically converted by the light detecting portion which is a P-N junction between the P-type region V and the InGaAs light-absorbing layer 3. As a result, the light is extracted from the device as an optical current by the electrodes. In the light receiving device of lower surface incident type according to the third embodiment, the same effect as that in the light receiving device of upper surface incident type according to the first and second embodiments is obtained. In each embodiment described above, an N-type semiconductor substrate is used, and the P-type region 7 is formed on the N-type semiconductor substrate. However, when a P-type semiconductor substrate is used, an N-type region is formed in place of the P-type region 7.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor light receiving device, comprising the steps of:

stacking a plurality of semiconductor layers of a first conductivity type to form a multilayered semiconductor substrate;

diffusing one of Sn and Zn in the multilayered semiconductor substrate to form a region of the second conductivity type in the multilayered semiconductor substrate;

wet etching a surface of the region of the second conductivity type in the multilayered semiconductor substrate using hydrochloric acid as a liquid phase etchant having a face orientation dependency, wherein said surface consists of an InP layer; and stirring the liquid phase etchant during the wet etching step, wherein the wet etching step produces an uneven surface having V-grooves.

2. A method according to claim 1, wherein the step of stacking to form said multilayered semiconductor substrate comprises the step of sequentially stacking an InP buffer layer, an InGaAs light-absorbing layer, an InGaAsP anti-melt-back layer, and an InP window layer on an InP crystal substrate.

3. A method according to claim 1, wherein a shape of said uneven surface is determined depending on a size of a wafer, a flow rate of etching solution, a concentration of an etchant.

4. A method according to claim 1, wherein said uneven surface is made of a plurality of continuous inclined crystal faces.

5. A method according to claim 4, wherein said inclined crystal faces are formed as V-shaped grooves which are arranged in the same direction.

6. A method according to claim 1, wherein the stirring step occurs in a petri dish having a rotor, and wherein the rotor is driven at a rotational speed of about 1,000 rpm for about 10 minutes.

* * * * *

UNITED STATES PATENT AND TRADEMARK OFFICE
CERTIFICATE OF CORRECTION

PATENT NO. : 5,731,213
DATED : March 24, 1998
INVENTOR(S) : Reiji ONO

It is certified that error appears in the above-indentified patent and that said Letters Patent is hereby corrected as shown below:

Title page, Item [57], in the Abstract,
        line 2, "principle" should read --principal--;
        line 8, "principle" should read --principal--; and
        line 11, "principle" should read --principal--.

Claim 3, col. 10, line 23, after "solution," insert --and--.

Signed and Sealed this

Twentieth Day of July, 1999

Attest:

*Attesting Officer*

Q. TODD DICKINSON

*Acting Commissioner of Patents and Trademarks*